(12) United States Patent
Saitou et al.

(10) Patent No.: US 7,994,505 B2
(45) Date of Patent: Aug. 9, 2011

(54) LIQUID CRYSTAL DISPLAY DEVICE

(75) Inventors: Terunori Saitou, Mobara (JP);
Yoshiharu Owaku, Mobara (JP); Takuo Kaitoh, Mobara (JP); Hidekazu Miyake, Mobara (JP)

(73) Assignee: Hitachi Displays, Ltd., Chiba (JP)

( * ) Notice: Subject to any disclaimer, the term of this patent is extended or adjusted under 35 U.S.C. 154(b) by 214 days.

(21) Appl. No.: 12/534,904

(22) Filed: Aug. 4, 2009

(65) Prior Publication Data
US 2010/0032673 A1 Feb. 11, 2010

(30) Foreign Application Priority Data

Aug. 6, 2008 (JP) ................ 2008-203188

(51) Int. Cl.
*H01L 33/00* (2010.01)
(52) U.S. Cl. ............ 257/59; 257/72; 257/E33.004; 257/E33.014

(58) Field of Classification Search ............ 257/59, 257/72, E33.004, E33.014
See application file for complete search history.

(56) References Cited

U.S. PATENT DOCUMENTS

2007/0284580 A1* 12/2007 Lim et al. ............ 257/66
2009/0050896 A1* 2/2009 Kaitoh et al. ............ 257/72

FOREIGN PATENT DOCUMENTS

JP     05-055570     3/1993

* cited by examiner

*Primary Examiner* — Victor Mandala
(74) *Attorney, Agent, or Firm* — Antonelli, Terry, Stout & Kraus, LLP.

(57) ABSTRACT

A liquid crystal display device includes a semiconductor layer which is formed of a poly-Si layer and an a-Si layer and formed above a gate electrode with a gate insulating film interposed therebetween. A source electrode or a drain electrode is formed above the semiconductor layer. An n+Si layer is formed between the source electrode or the drain electrode and the semiconductor layer. Since ends of the source electrode or the drain electrode are formed inside ends of the semiconductor layer, leak current at the ends of the semiconductor layer can be reduced.

6 Claims, 6 Drawing Sheets

LIQUID CRYSTAL DISPLAY DEVICE

The present application claims priority from Japanese applications JP2008-203188 filed on Aug. 6, 2008, the content of which is hereby incorporated by reference into this application.

BACKGROUND OF THE INVENTION

1. Field of the Invention

The present invention relates to a display device and more particularly to a liquid crystal display device in which a drive circuit is formed around a display region, and an active region of a thin film transistor is different between the display region and a peripheral circuit part.

2. Background Art

In liquid crystal display devices, a color filter substrate on which color filters and the like are formed at positions corresponding to pixel electrodes is arranged so as to face a TFT substrate on which the pixel electrodes, thin film transistors (TFTs), and the like are formed in a matrix, and liquid crystal is interposed between the TFT substrate and the color filter substrate. An image is formed by controlling optical transmittance of liquid crystal molecules for each pixel.

Data lines extending in the vertical direction and arranged in the horizontal direction, and scanning lines extending in the horizontal direction and arranged in the vertical direction are formed on the TFT substrate. A pixel is formed in each region surrounded by the data lines and the scanning lines. The pixel is mainly formed of a pixel electrode and a thin film transistor (TFT) which is a switching element. Numeral pixels formed in a matrix in this manner form a display region.

Scanning line drive circuits driving the scanning lines and data line drive circuits driving the data lines are disposed outside the display region. Conventionally, as the scanning line drive circuit and the data line drive circuit, IC drivers have been mounted externally. Some IC drivers are connected to the TFT substrate by a tape carrier method or the like; others are directly mounted on the TFT substrate as chips.

On the other hand, a technique for forming a drive circuit with a TFT around a display region has been developed because of a demand for a reduction in size of the entire display device while ensuring the display region. In such a display device, a-Si is used for a channel part in a TFT formed in the display region, and poly-Si is used for a channel part in a TFT formed in a drive circuit part. That is, a-Si having small leak current is used in the display region, and poly-Si having high electron mobility is used in the drive circuit part.

In general, the bottom gate structure is adopted in the TFT using a-Si, and the top gate structure is adopted in the TFT using poly-Si. Accordingly, TFTs having different structure must be formed on one substrate, which complicates the manufacturing process. Patent Document 1 discloses a configuration in which the TFT using poly-Si also adopts the bottom gate structure for preventing the process from becoming complicated. In this configuration, a poly-Si layer which serves as a channel is first formed on a gate insulating film formed on a gate electrode, and an a-Si layer is formed on the poly-Si layer. A contact layer formed of an n+layer is formed on the a-Si layer, and source/drain electrodes (SD electrodes) are formed on the contact layer. The TFT using poly-Si for the channel is configured as described above, so that the number of steps which can be shared in common between the TFT using a-Si for the channel and the TFT using poly-Si for the channel is increased, thereby simplifying the manufacturing process.

[Patent Document 1] JP-A-5-55570

SUMMARY OF THE INVENTION

In the technique disclosed in Patent Document 1, the poly-Si layer is formed on the gate insulating layer formed on the gate electrode, the a-Si layer is formed on the poly-Si layer, and the n+layer is formed on the a-Si layer for establishing contact. This configuration allows an ON current to flow through the poly-Si layer having high mobility without problems when a transistor is turned on. However, there arises a problem of leak current when the transistor is turned off.

FIG. 6 is a cross sectional view showing the configuration of a TFT having a channel made of poly-Si similar to the TFT disclosed in Patent Document 1. In FIG. 6, a gate electrode 103 is formed on an underlying film 102, and a gate insulating film 104 is formed so as to cover the gate electrode 103. A poly-Si layer 107 is formed on the gate insulating film 104, and an a-Si layer 108 is formed on the poly-Si layer 107. An n+Si layer 109 is formed on the a-Si layer 108. Since the a-Si layer 108 and the n+Si layer 109 are formed by photolithography using the same mask, these layers have the same shape in a plane. A source electrode 110 and a drain electrode 111 are formed on the n+Si layer 109.

In the configuration shown in FIG. 6, there arises no problem when a positive voltage is applied to the gate electrode 103 to flow an ON current into the TFT. However, there arises a problem when a zero voltage or a negative voltage is applied to the gate electrode 103 to turn off the TFT. FIG. 7 shows the relationship between a gate voltage (VG) and a drain current (Id) of the TFT. For the characteristics of the TFT, the drain current must flow when a positive voltage is applied to the gate electrode 103, while the drain current must be cut off, that is, the drain current must not flow when a zero voltage or a negative voltage is applied to the gate electrode 103. The dotted line in FIG. 7 indicates the relationship between the gate voltage and the drain current of a general TFT using a-Si. When the gate voltage reaches a certain value, the drain current is saturated, and only slight leak current flows when the gate potential becomes zero or negative.

However, in the stacked structure of the poly-Si film and the a-Si film shown in FIG. 6, a phenomenon that the drain current is not cut off even when the gate electrode 103 is set at the zero potential or the negative potential has been observed. This means that the TFT cannot serve as a switching element. This phenomenon is considered to occur as follows.

In FIG. 6, when a negative voltage is applied to the gate electrode 103, holes are induced in the poly-Si layer 107. No potential barrier exists between the poly-Si layer 107 and the source electrode 110 and between the poly-Si layer 107 and the drain electrode 111. Accordingly, the current generated by the holes directly flows into the drain electrode 111. Accordingly, the TFT is not turned off.

The invention is directed to provide a countermeasure for preventing the phenomenon that the TFT is not turned off in the TFT having the active layer with the a-Si layer 108 and the poly-Si layer 107 stacked to each other.

The invention has been made to overcome the above problem, and specific means will be described below.

(1) A liquid crystal display device includes: a display region having pixel electrodes and TFTs for pixel formed in a matrix; and a drive circuit including a TFT for drive circuit and formed around the display region, wherein a semiconductor layer of the TFT for pixel is formed only of an a-Si layer, the TFT for drive circuit has a first direction in which carriers move and a second direction perpendicular to the first direction, the TFT for drive circuit including a gate electrode, a gate insulating film covering the gate electrode, and a semiconductor layer with a poly-Si layer and an a-Si layer stacked in this order on the gate insulating film, an n+Si layer and a source electrode are provided at a part of one edge portion of the semiconductor layer in the first direction, the n+Si layer and the source electrode covering one side wall portion of the semiconductor layer, an n+Si layer and a drain electrode are provided at apart of the other edge portion of the semiconductor layer in the first direction, the n+Si layer and the drain electrode covering the other side wall portion of the semiconductor layer, and ends of the semiconductor layer of the TFT for drive circuit reside outside ends of the source electrode and ends of the drain electrode in the second direction.

(2) The liquid crystal display device according to (1), wherein the dimension of the semiconductor layer in the second direction is greater than that in the first direction in the TFT for drive circuit.

(3) The liquid crystal display device according to (1), wherein ends of the gate electrode reside outside the semiconductor layer in the second direction in the TFT for drive circuit.

(4) A liquid crystal display device includes: a display region having pixel electrodes and TFTs for pixel formed in a matrix; and a drive circuit including a TFT for drive circuit and formed around the display region, wherein a semiconductor layer of the TFT for pixel is formed only of an a-Si layer, the TFT for drive circuit has a first direction in which carriers move and a second direction perpendicular to the first direction, the TFT for drive circuit including a gate electrode, a gate insulating film covering the gate electrode, and a semiconductor layer with a poly-Si layer and an a-Si layer stacked in this order on the gate insulating film, an n+Si layer and a source electrode are provided at one edge portion of the semiconductor layer, the n+Si layer and the source electrode covering one side wall portion of the semiconductor layer, an n+Si layer and a drain electrode are provided at the other edge portion of the semiconductor layer, the n+Si layer and the drain electrode covering the other side wall portion of the semiconductor layer, and the width of the semiconductor layer of the TFT for drive circuit in the second direction is greater than that of the source electrode or the drain electrode.

(5) The liquid crystal display device according to (4), wherein the dimension of the semiconductor layer in the second direction is greater than that in the first direction in the TFT for drive circuit.

(6) The liquid crystal display device according to (4), wherein the width of the gate electrode is greater than that of the semiconductor layer in the second direction in the TFT for drive circuit.

According to the invention, it is possible to form a bottom-gate-type TFT having a channel using an a-Si layer in a pixel region and a bottom-gate-type TFT having a channel using a poly-Si layer in a drive circuit region. Therefore, a liquid crystal display device having a drive circuit built therein can be achieved without significantly increasing the steps of the manufacturing process.

Further, the invention can reduce an OFF current of the TFT having the channel using the poly-Si layer and formed in a drive circuit region. Therefore, a liquid crystal display device with less malfunction and high reliability can be achieved.

DESCRIPTION OF THE PREFERRED EMBODIMENT

The invention will be described in detail according to an embodiment.

Figure 1:
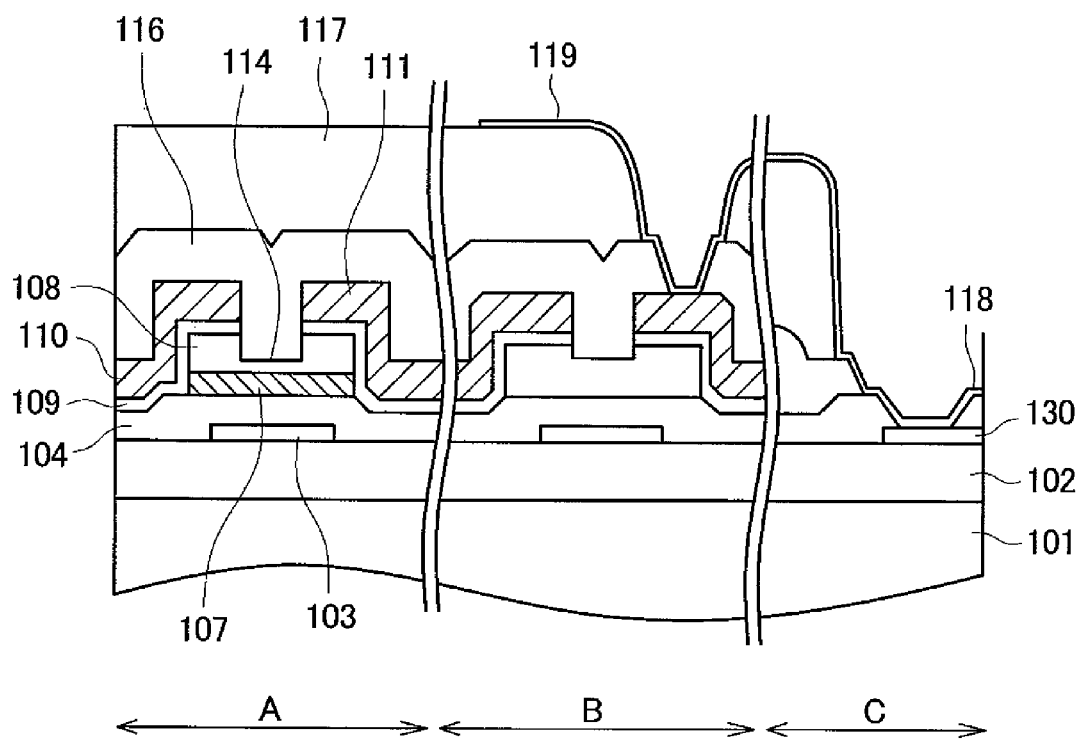
FIG. 1 is a schematic cross sectional view showing an embodiment of the invention.

FIG. 1 is a schematic cross sectional view showing the configuration of an embodiment of the invention. In FIG. 1, a TFT shown in a region A on the left is a TFT which includes a poly-Si layer 107 and an a-Si layer 108 stacked to each other and is used in a drive circuit part. A TFT shown in a region B on the right is a TFT which is used in a pixel part. A terminal part shown in a region C is formed on the further right of the TFT in the pixel part. Although the drive circuit part TFT, the pixel part TFT, and the terminal part are adjacent with one another in FIG. 1 for easy comparison, the elements are formed apart from with one another in an actual display device.

In FIG. 1, an underlying film 102 is formed on a TFT substrate 101. Although the underlying film 102 is formed of a single layer of an SiN film in the embodiment, it may be formed of a two-layered film of SiN and $SiO_2$. A gate electrode 103 is formed on the underlying film 102. A gate insulating film 104 is formed so as to cover the gate electrode 103. In the TFT for drive circuit part on the left in FIG. 1, a poly-Si layer 107 is formed on the gate insulating film 104. The poly-Si layer 107 serves as a channel part 114 of the TFT. The thickness of the poly-Si layer 107 is about 50 nm. An a-Si layer 108 is formed so as to cover the poly-Si layer 107. The thickness of the a-Si layer 108 is about 150 nm.

Figure 2:
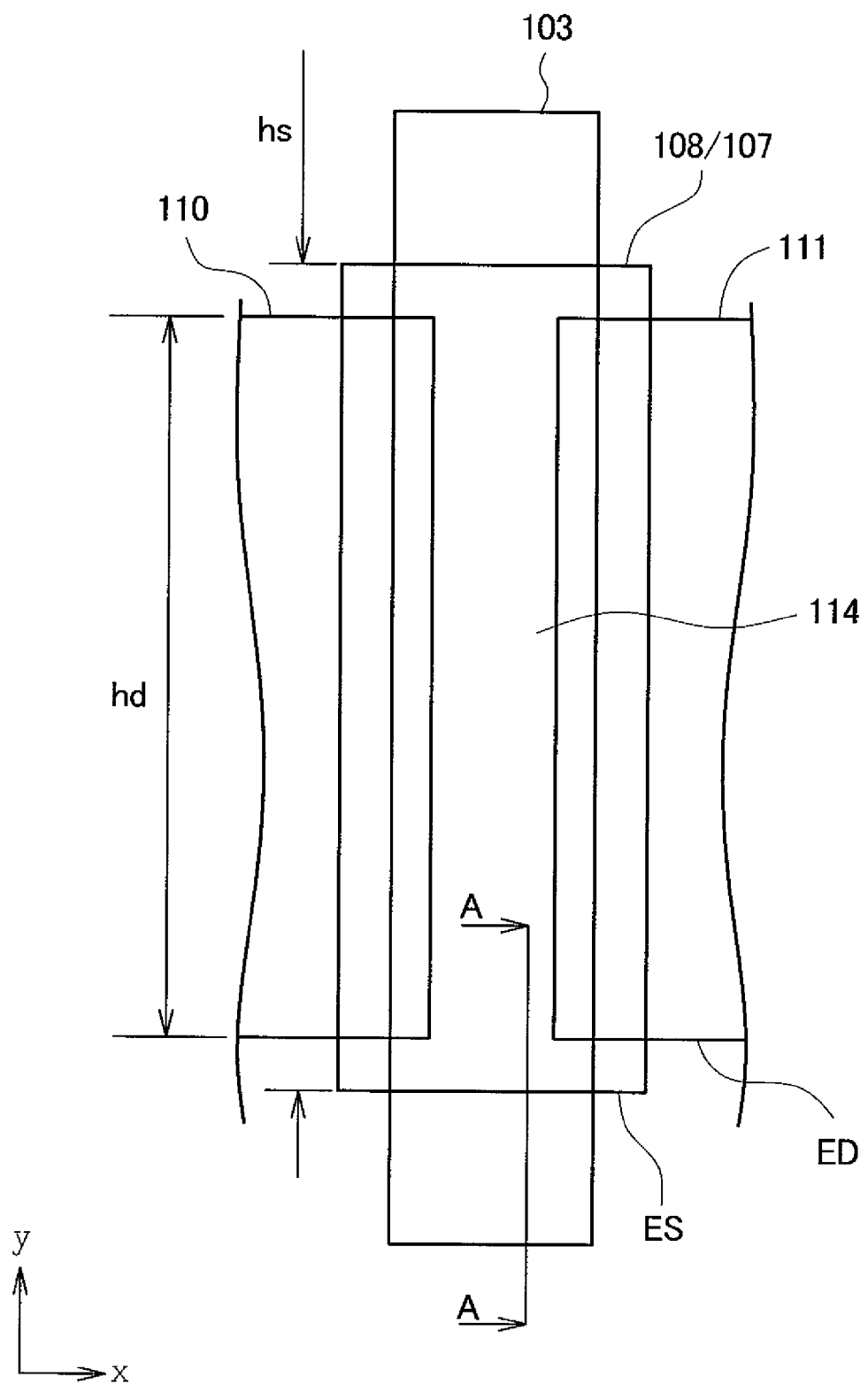
FIG. 2 is a perspective plan view showing the main part of the embodiment of the invention.
Figure 3:
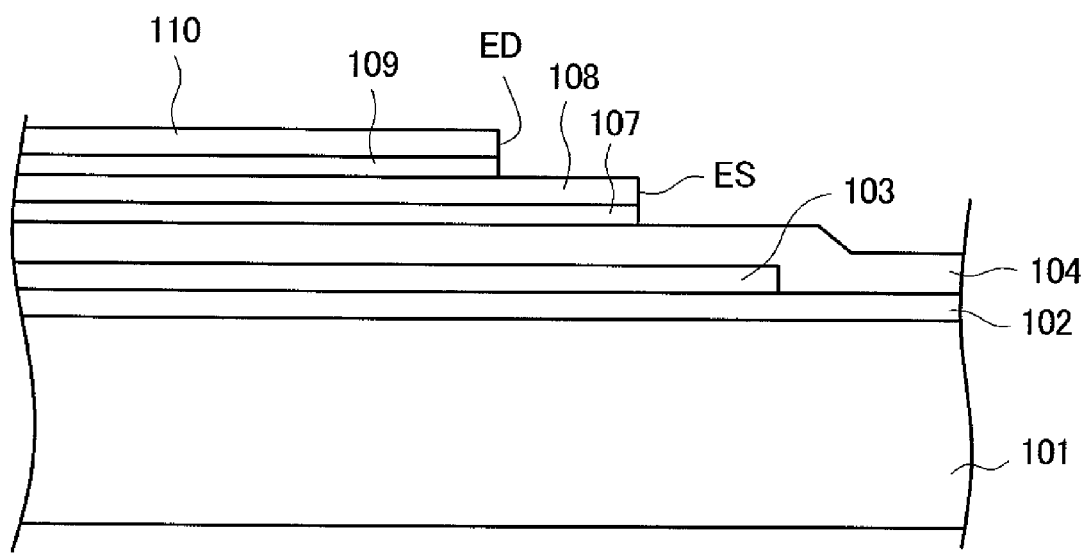
FIG. 3 is an A-A cross sectional view in FIG. 2.

The invention has a feature in that an n+Si layer 109 is formed so as to cover the upper portion and side wall portions of the a-Si layer 108 and the side wall portions of the poly-Si layer 107. With this configuration, leak current is suppressed in an OFF state. Further, the invention has a feature in that, as shown in FIGS. 2 and 3, the layout of a semiconductor layer formed of the a-Si layer 108 and the poly-Si layer 107 and a drain electrode 111 or a source electrode 110 are formed to have a specific configuration, whereby leak current is further reduced in the OFF state of the TFT.

In FIG. 1, the n+Si layer 109 is formed on the a-Si layer 108 in the regions A and B. By forming the n+Si layer 109, an ohmic contact with the a-Si layer 108 is formed, and at the same time leak current during the OFF state is suppressed. In the region A, the n+Si layer 109 covers not only the a-Si layer 108 but also the side wall portions of the poly-Si layer 107.

A current flowing through the TFT in the region A is mainly regulated by a current flowing through the poly-Si layer 107. This is because the poly-Si layer 107 has much higher electron mobility than the a-Si layer 108. The current flowing through the poly-Si layer 107 flows along the side surface of the poly-Si layer 107 and flows into the source electrode 110 or the drain electrode 111.

Figure 6:
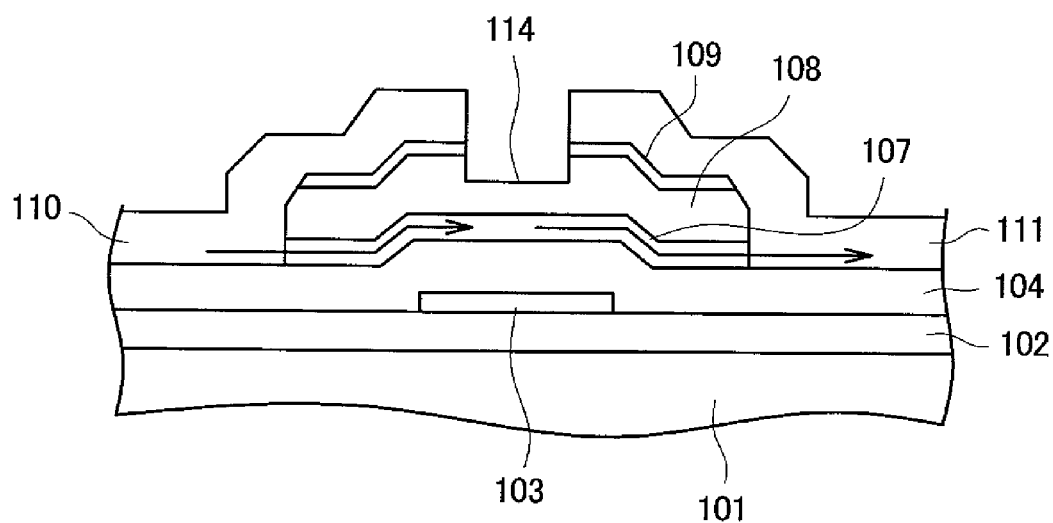
FIG. 6 is a cross sectional view showing a conventional example.
Figure 7:
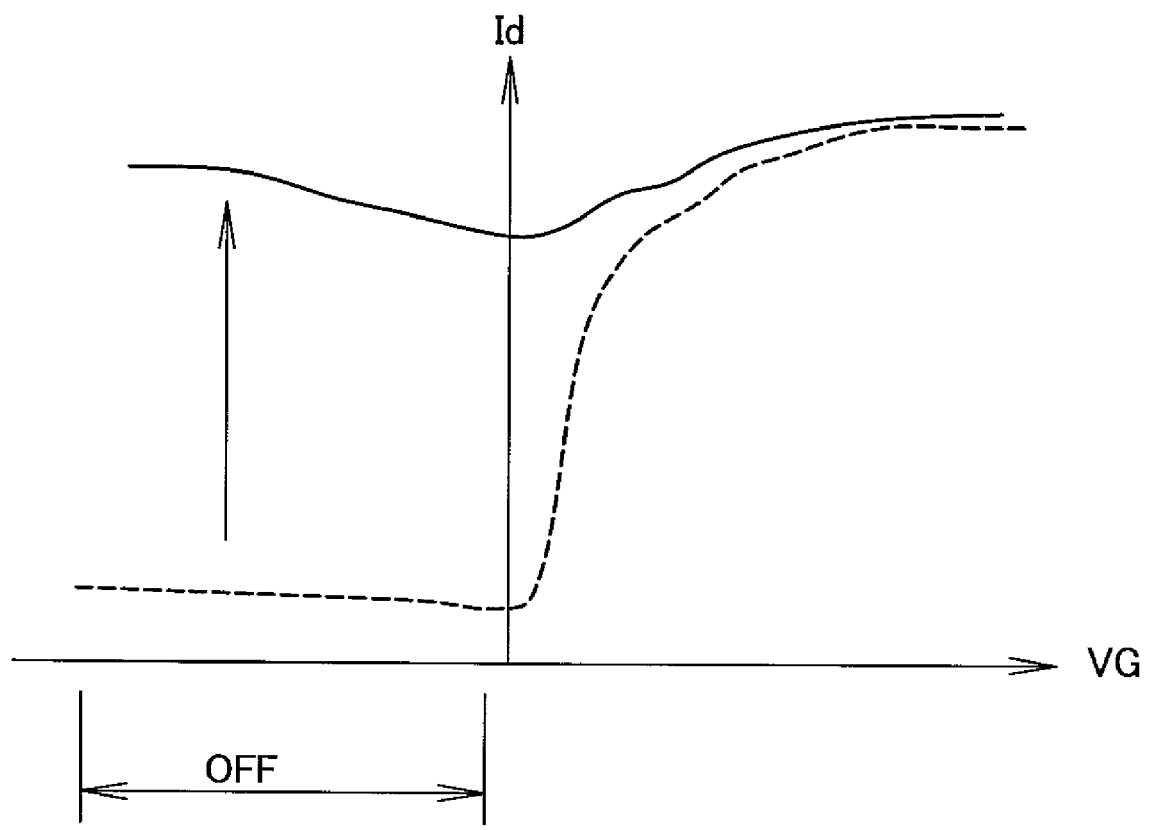
FIG. 7 shows ON-OFF current characteristics of a TFT.

In the conventional structure as shown in FIG. 6, since the side surface of the poly-Si layer 107 is in direct contact with a metal forming the source electrode 110 or the drain electrode 111, leak current is large. In the configuration shown in FIG. 1, on the other hand, since the n+Si layer 109 is formed between the poly-Si layer 107 and the source electrode 110 or the drain electrode 111, a barrier is formed between the poly-Si layer 107 and the source electrode 110 or the drain electrode 111. Therefore, leak current can be suppressed.

As will be described later, however, only with such a cross sectional configuration shown in FIG. 1, leak current cannot be sufficiently suppressed. In the invention, the planar shape of the source electrode 110 or the drain electrode 111 and the planar shape of the a-Si layer 108 are formed to have a specific configuration, whereby leak current is further reduced.

In FIG. 1, the source electrode 110 and the drain electrode 111 are formed on the n+Si layer 109. The source electrode 110 and the drain electrode 111 are formed of Al having high electrical conductivity. However, Al generates contamination with the n+Si layer 109. In addition, Al readily forms hillocks. In order to solve the problems, the bottom surface of Al is covered with a barrier metal of Mo, and the upper surface of Al is covered with a cap metal of Mo, in some cases.

After the n+Si layer 109 and the source electrode 110 or the drain electrode 111 are formed on the entire surface, patterning is performed by photolithography. In this case, since an undeveloped portion present between the source electrode 110 and the drain electrode 111 impairs the characteristics of the TFT, the upper portion of the a-Si layer 108 is dry-etched by channel etching, providing a channel region of the pure a-Si layer 108.

Thereafter, the entire TFT is protected by an inorganic passivation film 116 made of SiN. An organic passivation film 117 is formed using an acrylic resin, a polyimide resin, or the like on the inorganic passivation film 116. The organic passivation film 117 is formed as thick as 1 μm to 4 μm because it also serves as a planarization film.

In FIG. 1, on the right of the TFT for drive circuit part shown in the region A, the TFT used for the pixel part shown in the region B is shown. The TFT in the pixel part has the same structure as that of the TFT for drive circuit part excepting that the poly-Si layer 107 is not formed in the channel part 114. Since the TFT for drive circuit part is required to operate at a high speed, poly-Si having high electron mobility is used for a main region where electrons move in the channel part 114. On the other hand, since the pixel part is not required to operate at such a high speed as the drive circuit part, a-Si having small leak current is used for the channel part 114.

The drain electrode 111 of the TFT in the pixel part is electrically conducted to a pixel electrode 119 and supplies a data signal to the pixel part. That is, a through hole is formed through the passivation film 116 covering the pixel part TFT and the planarization film of the organic film 117, so that the pixel electrode 119 and the drain electrode 111 are electrically conducted to each other through the through hole. The pixel electrode 119 is formed of an ITO film which is a transparent conductive film.

In FIG. 1, the terminal part is shown in the region C on the further right of the TFT for pixel part. A terminal part wiring 130 in FIG. 1 is formed in the same layer as the gate electrode 103. That is, the terminal part wiring 130 is formed of the same material as that of the gate electrode 103 simultaneously with the gate electrode 103. The terminal part wiring 130 is protected by the gate insulating film 104, the inorganic passivation film 116, and the organic passivation film 117. In the terminal part, a terminal part contact hole is formed through the organic passivation film 117, the inorganic passivation film 116, and the gate insulating film 104 for the connection with an external circuit.

The terminal part wiring 130 is formed of a metal and therefore prone to corrosion due to an external environment. In order to prevent the corrosion of the terminal part wiring 130, the terminal part is covered with an ITO film which is a transparent conductive film as a terminal part conductive film 118. The ITO film is made of a metal oxide and therefore chemically stable. The ITO film as the terminal part conductive film 118 is formed simultaneously with the ITO film of the pixel electrode 119.

FIG. 2 is a perspective plan view of the drive circuit part TFT shown in the region A of FIG. 1 according to the embodiment of the invention. In FIG. 2, the gate electrode 103 is formed in an elongated shape in the vertical direction at the lowermost layer. The semiconductor layer formed of the poly-Si layer 107 and the a-Si layer 108 is formed above the gate electrode 103 with the gate insulating film 104 (not shown) interposed therebetween. The source electrode 110 or the drain electrode 111 is formed above the semiconductor layer. The n+Si layer 109 (not shown) is formed between the source electrode 110 or the drain electrode 111 and the semiconductor layer. The channel part 114 is formed between the source electrode 110 and the drain electrode 111. Electrons or holes move through the channel part 114 in the x-direction.

When a defect exists in the semiconductor layer, a pair of a hole and an electron is readily generated in that portion. Such a defect tends to occur particularly at ends of the semiconductor layer after patterning the same. In addition, impurities are frequently attached to the ends of the semiconductor layer when the semiconductor layer is patterned by photolithography. The presence of impurities causes leak current. Such leak current has no significant influence on an ON current of the TFT but exerts a significant influence on leak current during the OFF state of the TFT.

In the invention, ends ED of the source electrode 110 or the drain electrode 111 in the y-direction are formed inside ends ES of the semiconductor layer in the y-direction as shown in FIG. 2, whereby leak current is prevented from flowing through the semiconductor layer. That is, a width hs of the semiconductor layer in the y-direction is greater than a width hd of the source electrode 110 or the drain electrode 111 in the y-direction. Accordingly, since the source electrode 110 and the drain electrode 111 are not present in the ends ES of the semiconductor layer in the y-direction, current conducting at ends of the semiconductor layer between the source electrode 110 and the drain electrode 111 can be suppressed. In FIG. 2, ends of the gate electrode 103 in the y-direction are present outside the ends ES of the semiconductor layer in the y-direction. In other words, the width of the gate electrode 103 in the y-direction is greater than that of the semiconductor layer in the y-direction.

FIG. 3 is an A-A cross sectional view in FIG. 2. In FIG. 3, the layers at and above the inorganic passivation film 116 in FIG. 1 are not shown. In FIG. 3, the gate electrode 103 is formed on the underlying film 102 of the TFT substrate 101. The gate insulating film 104 is formed so as to cover the gate electrode 103. The semiconductor layer formed of the poly-Si layer 107 and the a-Si layer 108 is formed on the gate insulating film 104. The n+Si layer 109 and the source electrode 110 are formed on the semiconductor layer.

In FIG. 3, the end ED of the source electrode 110 or the n+Si layer 109 resides inside the end ES of the poly-Si layer 107 and the a-Si layer 108. From this fact, there is no influence of an electric field from the source electrode 110 or the drain electrode 111 on the end ES of the poly-Si layer 107 and the a-Si layer 108. Accordingly, the leak current flowing at the end ES of the poly-Si layer 107 and the a-Si layer 108 can be suppressed.

Figure 4:
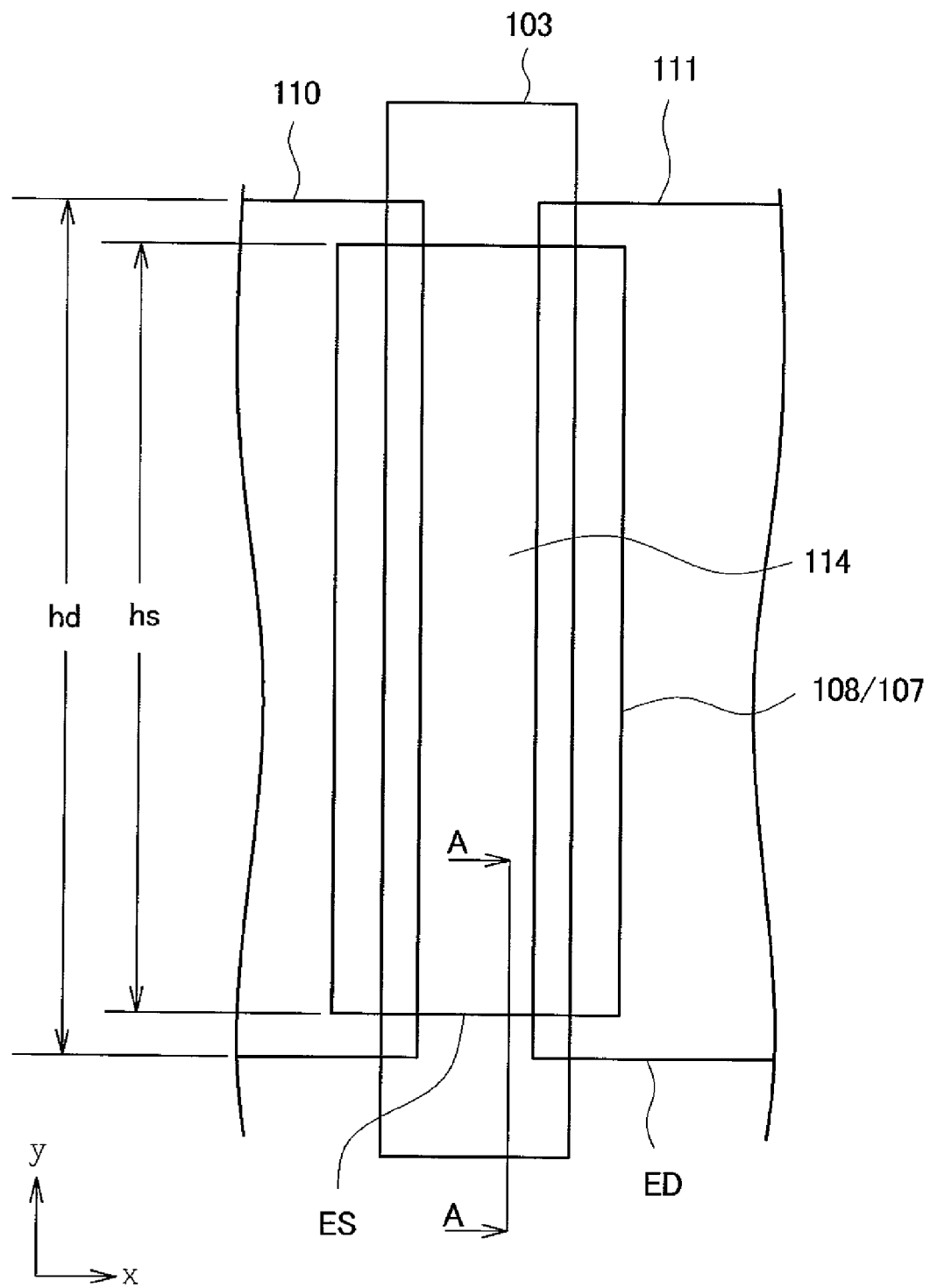
FIG. 4 is a perspective plan view showing a comparative example.

FIG. 4 is a perspective plan view of the drive circuit part TFT shown in the region A of FIG. 1 in a comparative example. In FIG. 4, the gate electrode 103 is formed in an elongated shape in the vertical direction at the lowermost layer. The semiconductor layer formed of the poly-Si layer 107 and the a-Si layer 108 is formed above the gate electrode 103 with the gate insulating film 104 (not shown) interposed therebetween. The source electrode 110 or the drain electrode 111 is formed above the semiconductor layer. The n+Si layer is formed between the source electrode 110 or the drain electrode 111 and the semiconductor layer. The channel part 114 is formed between the source electrode 110 and the drain electrode 111. Electrons or holes move through the channel part in the x-direction.

FIG. 4 is different from FIG. 2 in that the ends ED of the source electrode 110 or the drain electrode 111 in the y-direction are formed outside the ends ES of the semiconductor layer in the y-direction in FIG. 4. That is, the width hs of the semiconductor layer in the y-direction is smaller than the width hd of the source electrode 110 or the drain electrode 111 in the y-direction. From this fact, since the source electrode 110 and the drain electrode 111 are present with the ends ES of the semiconductor layer in the y-direction interposed therebetween, the presence of defect at the ends of the semiconductor layer is likely to cause leak current. That is, the defect formed in the semiconductor layer is likely to generate an electron-hole pair, which results in the leak current during the OFF state.

Figure 5:
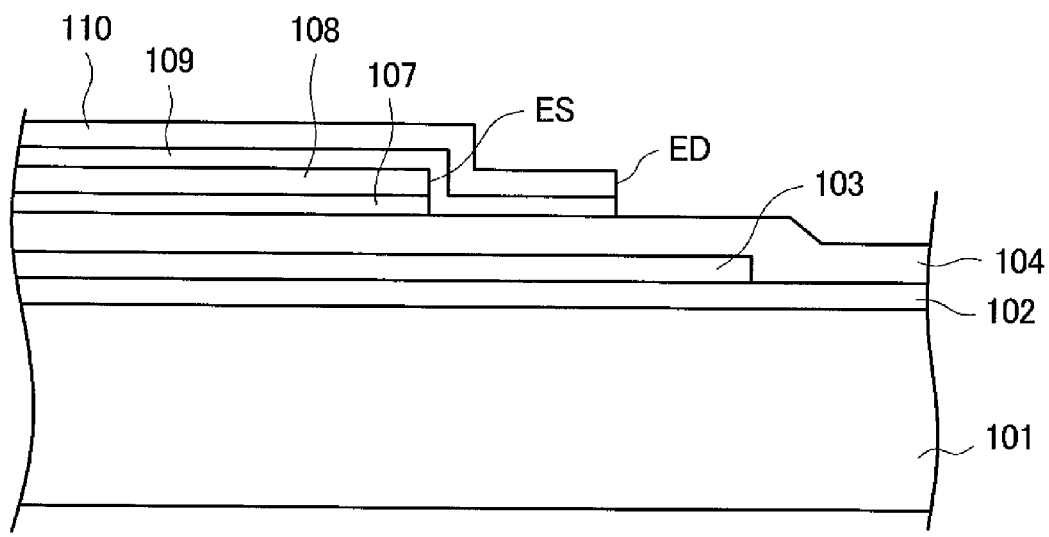
FIG. 5 is a B-B cross sectional view in FIG. 4.

FIG. 5 is a B-B cross sectional view in FIG. 4. In FIG. 5, the layers at and above the inorganic passivation film 116 in FIG. 1 are not shown. In FIG. 5, the gate electrode 103 is formed on the underlying film 102 of the TFT substrate 101. The gate insulating film 104 is formed so as to cover the gate electrode 103. The semiconductor layer formed of the poly-Si layer 107 and the a-Si layer 108 is formed on the gate insulating film 104. The n+Si layer 109 and the source electrode 110 are formed on the semiconductor layer.

In FIG. 5, the end ED of the source electrode 110 or the n+Si layer 109 resides outside the end ES of the poly-Si layer 107 and the a-Si layer 108. From this fact, electrodes due to the source electrode 110 and the drain electrode 111 are formed at the end ES of the semiconductor layer formed of the poly-Si layer 107 and the a-Si layer 108. The presence of defect at the end ES of the semiconductor layer in the y-direction generates an electron-hole pair, which causes the leak current during the OFF state.

The configuration described above exerts an effect particularly when the poly-Si layer 107 is present. This is because the a-Si layer 108 originally has small leak current as well as few holes.

As describe above, since the current flowing at the ends ES of the poly-Si layer 107 and the a-Si layer 108 can be suppressed according to the invention, the leak current during the OFF state can be reduced. Therefore, a liquid crystal display device having a built-in drive circuit with stable characteristics can be achieved.

What is claimed is:

1. A liquid crystal display device comprising:
  a display region having pixel electrodes and TFTs for pixel formed in a matrix; and a drive circuit including a TFT for drive circuit and formed around the display region, wherein
  a semiconductor layer of the TFT for pixel is formed only of an a-Si layer,
  the TFT for drive circuit has a first direction in which carriers move and a second direction perpendicular to the first direction, the TFT for drive circuit including a gate electrode, a gate insulating film covering the gate electrode, and a semiconductor layer with a poly-Si layer and an a-Si layer stacked in this order on the gate insulating film, an n+Si layer and a source electrode are provided at a part of one edge portion of the semiconductor layer in the first direction, the n+Si layer and the source electrode covering one side wall portion of the semiconductor layer, an n+Si layer and a drain electrode are provided at a part of the other edge portion of the semiconductor layer in the first direction, the n+Si layer and the drain electrode covering the other side wall portion of the semiconductor layer, and
  ends of the semiconductor layer of the TFT for drive circuit reside outside ends of the source electrode and ends of the drain electrode in the second direction.

2. The liquid crystal display device according to claim 1, wherein the dimension of the semiconductor layer in the second direction is greater than that in the first direction in the TFT for drive circuit.

3. The liquid crystal display device according to claim 1, wherein ends of the gate electrode reside outside the semiconductor layer in the second direction in the TFT for drive circuit.

4. A liquid crystal display device comprising:
  a display region having pixel electrodes and TFTs for pixel formed in a matrix; and a drive circuit including a TFT for drive circuit and formed around the display region, wherein
  a semiconductor layer of the TFT for pixel is formed only of an a-Si layer,
  the TFT for drive circuit has a first direction in which carriers move and a second direction perpendicular to the first direction, the TFT for drive circuit including a gate electrode, a gate insulating film covering the gate electrode, and a semiconductor layer with a poly-Si layer and an a-Si layer stacked in this order on the gate insulating film, an n+Si layer and a source electrode are provided at one edge portion of the semiconductor layer, the n+Si layer and the source electrode covering one side wall portion of the semiconductor layer, an n+Si layer and a drain electrode are provided at the other edge portion of the semiconductor layer, the n+Si layer and the drain electrode covering the other side wall portion of the semiconductor layer, and
  the width of the semiconductor layer of the TFT for drive circuit in the second direction is greater than that of the source electrode or the drain electrode.

5. The liquid crystal display device according to claim 4, wherein the dimension of the semiconductor layer in the second direction is greater than that in the first direction in the TFT for drive circuit.

6. The liquid crystal display device according to claim 4, wherein the width of the gate electrode is greater than that of the semiconductor layer in the second direction in the TFT for drive circuit.

* * * * *